(12) United States Patent
Kim et al.

(10) Patent No.: US 7,985,641 B2
(45) Date of Patent: Jul. 26, 2011

(54) SEMICONDUCTOR DEVICE WITH STRAINED TRANSISTORS AND ITS MANUFACTURE

(75) Inventors: Young Suk Kim, Kawasaki (JP); Yosuke Shimamune, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/434,944

(22) Filed: May 4, 2009

(65) Prior Publication Data

US 2009/0215240 A1 Aug. 27, 2009

Related U.S. Application Data

(62) Division of application No. 11/471,559, filed on Jun. 21, 2006, now abandoned.

(30) Foreign Application Priority Data

Feb. 22, 2006 (JP) .................................. 2006-045740

(51) Int. Cl.
*H01L 21/8238* (2006.01)
(52) U.S. Cl. ........ 438/199; 438/230; 438/300; 438/607; 257/E21.632
(58) Field of Classification Search .................. 438/300, 438/199, 230, 607; 257/E21.632
See application file for complete search history.

(56) References Cited

U.S. PATENT DOCUMENTS

| 6,214,679 | B1 | 4/2001 | Murthy et al. |
| 7,122,435 | B2 * | 10/2006 | Chidambaram et al. ...... 438/303 |
| 7,208,362 | B2 * | 4/2007 | Chidambaram .............. 438/199 |
| 7,407,860 | B2 | 8/2008 | Kim et al. |
| 2005/0035470 | A1 | 2/2005 | Ko et al. |
| 2005/0130454 | A1 | 6/2005 | Murthy et al. |
| 2006/0046367 | A1 * | 3/2006 | Rotondaro et al. ........... 438/199 |
| 2006/0289856 | A1 | 12/2006 | Shimamune et al. |

FOREIGN PATENT DOCUMENTS

| JP | 11-506567 B | 6/1999 |
| JP | 2001-024194 A | 1/2001 |
| JP | 2006-13428 A | 1/2006 |
| WO | WO-96/41367 | 12/1996 |
| WO | WO-2005/043591 A2 | 5/2005 |
| WO | WO-2006/011939 A3 | 2/2006 |

OTHER PUBLICATIONS

Ang, Kah Wee et al.,"Enhanced Performance in 50 nm N-MOSFETs with Silicon-Carbon Source/Drain Regions",*IEDM Tech. Dig.*, 2004, 1069, 3 pages.
Ghani, T. et al.,"A 90nm High Volume Manufacturing Logic Technology Featuring Novel 45nm Gate Length Strained Silicon CMOS Transistors",*IEDM Tech. Dig.*, 2003, 978, 3 pages. Kim, Y. S. et al.,"A Highly Robust SiGe Source Drain Technology realized by Disposable Sidewall Spacer (DSW) for 65nm Node and Beyond",*Proceedings of ESSDERC* 2005, 305-308.
USPTO, [TRINH] U.S. Appl. No. 11/471,559, [CTNF] Non-final Rejection mailed Dec. 2, 2008.
USPTO, [TRINH] U.S. Appl. No. 11/471,559, [CTRS] Restriction Requirement mailed Jul. 11, 2008.
U.S. Appl. No. 11/471,559, filed Jun. 21, 2006, Young Suk Kim, Priority under 35 USC § 120.
Japanese Office Action, mailed Mar. 15, 2011 for corresponding Japanese Application No. 2006-045740 with partial English translation.

* cited by examiner

*Primary Examiner* — Michael Trinh
(74) *Attorney, Agent, or Firm* — Fujitsu Patent Center

(57) ABSTRACT

A semiconductor device has: a semiconductor substrate made of a first semiconductor material; an n-channel field effect transistor formed in the semiconductor substrate and having n-type source/drain regions made of a second semiconductor material different from the first semiconductor material; and a p-channel field effect transistor formed in the semiconductor substrate and having p-type source/drain regions made of a third semiconductor material different from the first semiconductor material, wherein the second and third semiconductor materials are different materials. The semiconductor device having n- and p-channel transistors has improved performance by utilizing stress.

12 Claims, 12 Drawing Sheets

SEMICONDUCTOR DEVICE WITH STRAINED TRANSISTORS AND ITS MANUFACTURE

CROSS REFERENCE TO RELATED APPLICATION

This application is a Divisional application of parent application Ser. No. 11/471,559, filed Jun. 21, 2006, now abandoned, which is based upon and claims the benefits of priority from the prior Japanese Patent Application No. 2006-045740 filed on Feb. 22, 2006. The entire contents of the aforementioned parent and Japanese priority applications are incorporated herein by reference.

BACKGROUND OF THE INVENTION

1. Field of the Invention

The present invention relates to a semiconductor device and its manufacture method, and more particularly to a semiconductor device having strained transistors and its manufacture method.

2. Description of the Related Art

Micro patterning is progressing in order to improve the integration density and operation speed of a silicon semiconductor integrated circuit. As miniaturization advances, the gate length of a field effect transistor is shortened. At a gate length of 65 nm or shorter, there appears a limit in expecting the performance improvements through miniaturization.

Apart from miniaturization, strained transistors which improve the mobility of carriers by strain have been paid attention as a technique of improving the performance of a field effect transistor. Strain is generated in the channel region of a field effect transistor to increase the mobility of electrons or holes and improve the on-current characteristics.

Field effect transistors are classified by the gate electrode structure into junction type that a channel is controlled by a pn junction, MOS type that a channel is controlled from a gate electrode via an insulating film such as an oxide film, and MIS type that a channel is controlled by a Schottky gate electrode. The following description will be made by taking as an example the MOS type using a Si substrate. Mobility of electrons of an n-channel (N) MOS transistor is improved by tensile stress and a mobility of holes of a p-channel (P) MOS transistor is improved by compressive stress, along the channel length (gate length) direction.

If the source/drain regions of an NMOS transistor are made of silicon-carbon (Si—C) mixed crystals having a lattice constant smaller than that of a Si substrate, tensile stress is applied to Si crystals in the channel along the channel length direction, so that electron mobility is increased (Refer to K. Ang et al: IEDM Tech. Dig., 2004, p. 1069).

If the source/drain regions of a PMOS transistor are made of by silicon-germanium (Si—Ge) mixed crystals having a lattice constant larger than that of a Si substrate, compressive stress is applied to Si crystals in the channel along the channel length direction, so that hole mobility is increased (Refer to T. Ghani et al: IEDM Tech. Dig., 2003, p. 978 and Y. S. Kim et al: Proceedings of ESSDERC 2005, p. 305).

Apart from the strained transistor, a channeling phenomenon is known wherein as impurity ions are implanted into Si crystals, some impurity ions are implanted deeply. In order to prevent the channeling phenomenon, there is a proposal to grow Si—C or Si—Ge in a single-crystal state having a high dislocation density or in a polycrystalline state, on source/drain regions, grow an Si film thereon and then implant impurity ions (Refer to Japanese Patent Laid-open Publication No. JP-A-2001-24194).

Various techniques have been proposed to form a shallow junction in source/drain regions. In one proposal, an undoped silicide layer is formed on source/drain regions, a doped dielectric layer is vapor-deposited on the silicide layer, impurities in the dielectric layer are diffused into the silicide layer by pulse laser annealing, impurities in the silicide layer are moved by annealing to form a junction having a depth of 100 nm or shallower. It is described that the source/drain regions are made of silicon, silicon-germanium, silicon carbide, or gallium arsenide (Refer to PCT National Publication No. HEI-11-506567).

SUMMARY OF THE INVENTION

As stress is applied to a channel, carrier mobility is increased and a transistor performance can be improved. Electron mobility of an n-channel transistor is improved by tensile stress, and hole mobility of a p-channel transistor is improved by compressive stress.

An object of the present invention is to provide a semiconductor device having n- and p-channel transistors whose performances are respectively improved by utilizing stress.

According to one aspect of the present invention, there is provided a semiconductor device comprising: a semiconductor substrate made of a first semiconductor material; an n-channel field effect transistor formed in the semiconductor substrate and having n-type source/drain regions made of a second semiconductor material different from the first semiconductor material; and a p-channel field effect transistor formed in the semiconductor substrate and having p-type source/drain regions made of a third semiconductor material different from the first semiconductor material, wherein the second and third semiconductor materials are different materials.

According to another aspect of the present invention, there is provided a method of manufacturing a semiconductor device comprising the steps of: (1) forming gate electrodes above an n-channel field effect transistor region and a p-channel field effect transistor region of a semiconductor substrate made of a first semiconductor material; (2) forming a first insulating mask layer on the semiconductor substrate, covering the gate electrodes; (3) covering one of the n-channel field effect transistor region and the p-type field effect transistor region with a resist mask, anisotropically etching the first insulating mask layer in the other field effect transistor region to leave the first insulating mask layer of a sidewall spacer shape on sidewalls of the gate electrode of the other field effect transistor; (4) etching the semiconductor substrate in the other field effect transistor region by using the first insulating mask layer as an etching mask, to form first recesses; (5) epitaxially growing source/drain regions of a second semiconductor material different from the first semiconductor material, on the first recesses; (6) removing the first insulating mask layer; (7) forming sidewall spacers of an insulating material on sidewalls of the gate electrodes; (8) forming a second insulating mask layer covering the other field effect transistor region; (9) etching the semiconductor substrate in the one field effect transistor region by using the second insulating mask layer and the sidewall spacers, as an etching mask, to form second recesses; and (10) epitaxially growing source/drain regions of a third semiconductor material different from the first semiconductor material, on the second recesses.

It is possible to apply tensile stress to the channel of an n-channel transistor, and compressive stress to the channel of a p-channel transistor.

DESCRIPTION OF THE PREFERRED EMBODIMENTS

In the following, description is made on a method of manufacturing a semiconductor device according to an embodiment of the present invention, with reference to the accompanying drawings.

Figure 1A:
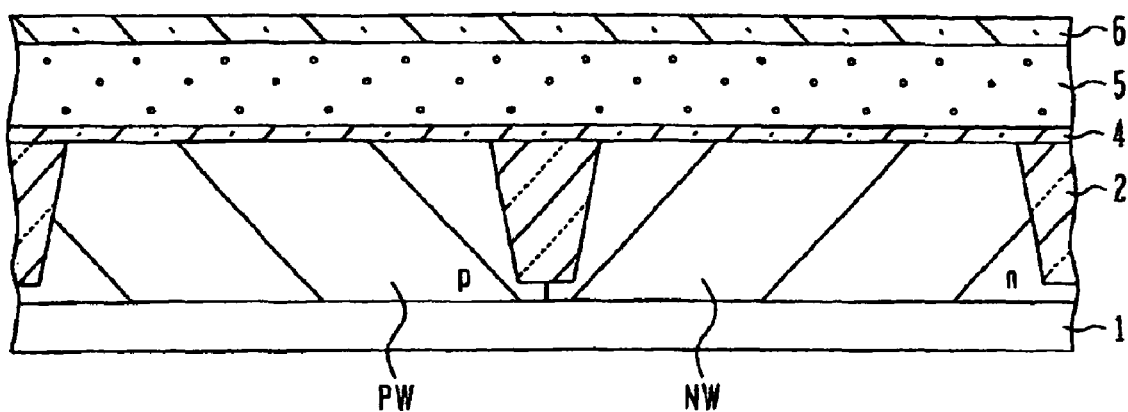
FIGS. 1A, 1B and 1C are cross sectional views illustrating processes of forming an isolation region in a semiconductor substrate and depositing a gate electrode forming layer.

As shown in FIG. 1A, a semiconductor substrate 1 made of a first semiconductor such as silicon is formed with an isolation region 2 defining active regions in which semiconductor elements are to be formed. The isolation region 2 can be formed, for example, by shallow trench isolation (STI). A buffer layer of silicon oxide is formed on the surface of the silicon substrate, and a silicon nitride film pattern having an opening above the isolation region is formed on the buffer layer. The silicon substrate 1 in the opening is etched to form a trench.

Figure 1B:
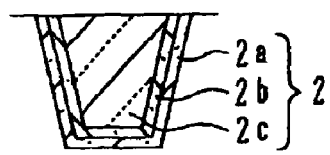

As shown in FIG. 1B, after the trench is formed, the silicon substrate surface exposed in the trench is thermally oxidized to form a first liner of a silicon oxide film 2a. A second liner of a silicon nitride film 2b is formed, for example, by chemical vapor deposition (CVD), the second liner covering the silicon oxide film 2a. After the liners of two types are formed, the trench is buried with a silicon oxide film 2c formed by high density plasma (HDP) CVD. Unnecessary silicon oxide film deposited on the substrate surface is polished and removed by chemical mechanical polishing (CMP). During this CMP, the silicon nitride film pattern functions as a stopper. After CMP, the silicon nitride film pattern is removed, for example, by hot phosphoric acid. The buffer layer of silicon oxide is also removed by dilute hydrofluoric acid or the like. In this manner, the isolation region by STI shown in FIG. 1B can be formed.

Figure 1C:
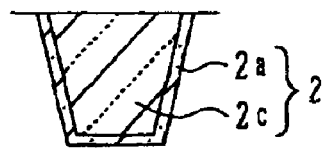

FIG. 1C shows another example of the STI structure. In this example, the liner 2b of silicon nitride is not formed, and the silicon oxide film 2C is directly deposited on the liner 2a of silicon oxide to bury the trench.

The HDP silicon oxide film generates compressive stress. Therefore, electron mobility in an NMOS transistor lowers and the transistor performance is degraded. The liner 2b of silicon nitride generates tensile stress, so that degradation of the performance of the NMOS transistor can be suppressed. In this embodiment, since tensile stress is generated in the source/drain regions as will be later described, the liner 2b of silicon nitride may not be formed in some cases. The process can be simplified in such cases.

Reverting to FIG. 1A, after the isolation region 2 is formed, a p-type well PW is formed in an NMOS transistor region by implanting p-type impurities and an n-type well NW is formed in a PMOS transistor region by implanting n-type impurities, respectively by isolating the regions by using resist masks. A silicon oxide film on the active region surface is removed by dilute hydrofluoric acid or the like, and the substrate surface is thermally oxidized again to form a gate insulating film 4 having a thickness of, e.g., 1.2 nm. Nitrogen may be introduced into the silicon oxide film. Another insulating film having a high dielectric constant may be stacked on the silicon oxide film. A polysilicon layer 5 having a thickness of, e.g., 100 nm is formed on the gate insulating film to form a gate electrode layer. A silicon nitride film 6 functioning as an etching mask is deposited on the polysilicon layer 5 by CVD or the like.

Figure 2:
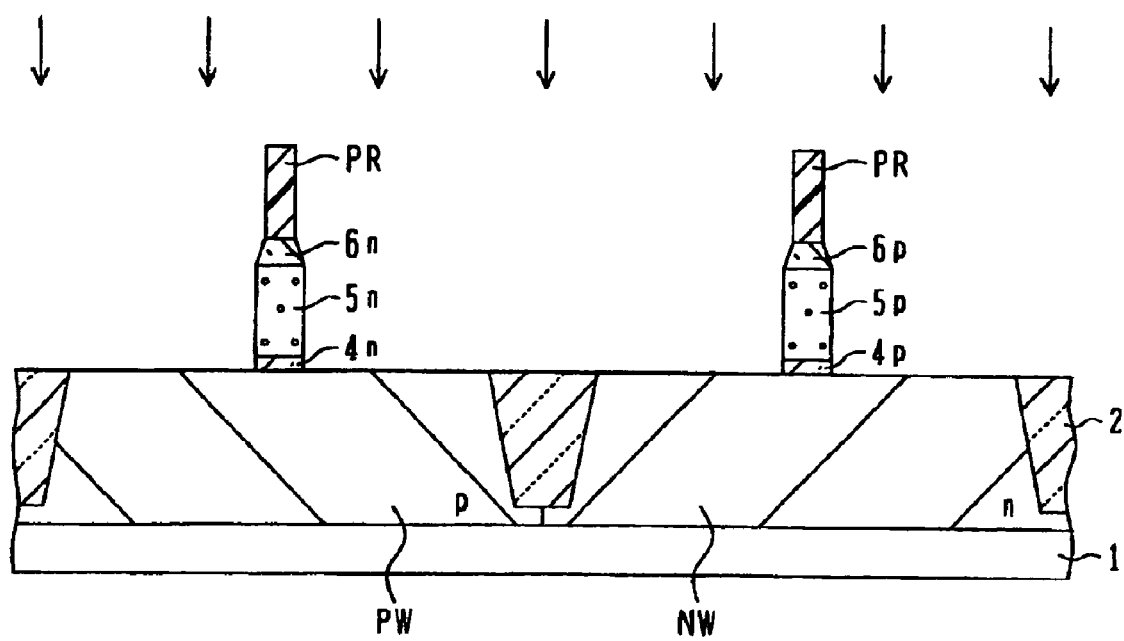
FIG. 2 is a cross sectional view illustrating a gate electrode forming process.

As shown in FIG. 2, a photoresist pattern PR having a gate electrode shape is formed, and the silicon nitride film 6, polysilicon layer 5 and gate insulating film 4 under the photoresist pattern are patterned by anisotropical etching. An affix n is added to constituent elements of the NMOS transistor and an affix p is added to constituent elements of the PMOS transistor. The photoresist pattern PR is thereafter removed by ashing or the like.

Next, a mask is formed which is used for forming source/drain regions of the NMOS transistor.

Figure 3A:
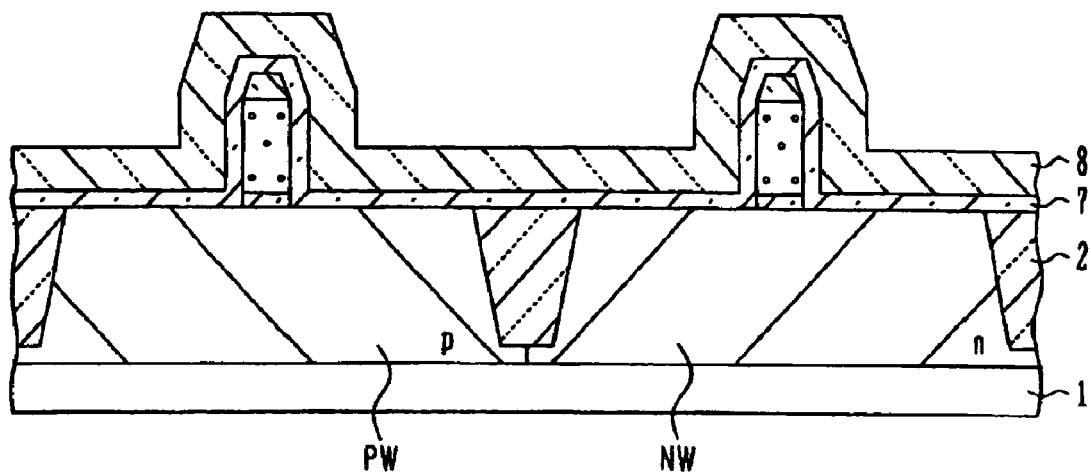
FIGS. 3A and 3B are cross sectional views illustrating processes of forming an insulating mask layer for forming source/drain regions of an NMOS transistor.

As shown in FIG. 3A, a silicon oxide 7 having a thickness of 5 nm to 30 nm and covering the gate electrode structures, is deposited on the substrate by thermal CVD at a temperature of 550° C. to 700° C. by using as Si source gas, for example, tetraethoxysilane (TEOS). A silicon nitride film 8 having a thickness of 10 nm to 60 nm is deposited on the silicon oxide film 7 by thermal CVD at a temperature of 600° C. to 800° C. by using $SiH_2Cl_2$ as Si source gas.

Figure 3B:
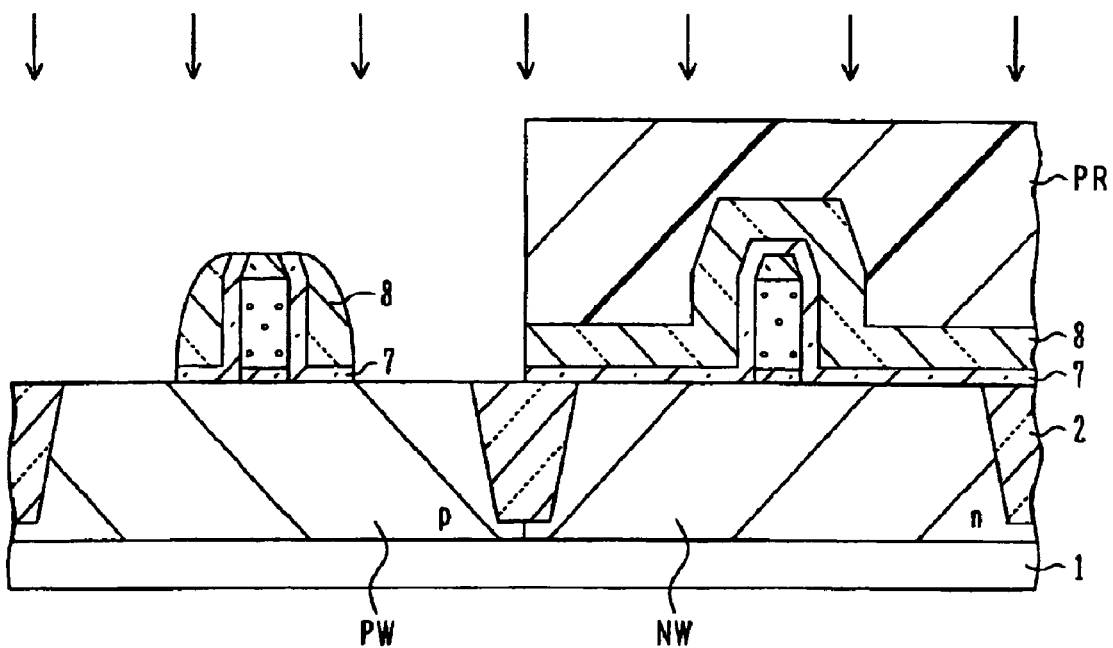

As shown in FIG. 3B, the PMOS transistor region is covered with a photoresist pattern PR, and the silicon nitride film 8 and silicon oxide film 7 in the NMOS transistor region are etched by anisotropical etching using hydrofluorocarbon as etching gas, to leave portions of a sidewall spacer shape on the sidewalls of the gate electrode structure. The photoresist pattern PR is thereafter removed. A mask is therefore formed exposing the source/drain regions of the NMOS transistor region.

Next, by using the insulating films 7 and 8 as an etching mask, the NMOS transistor region is etched.

Figure 4A:
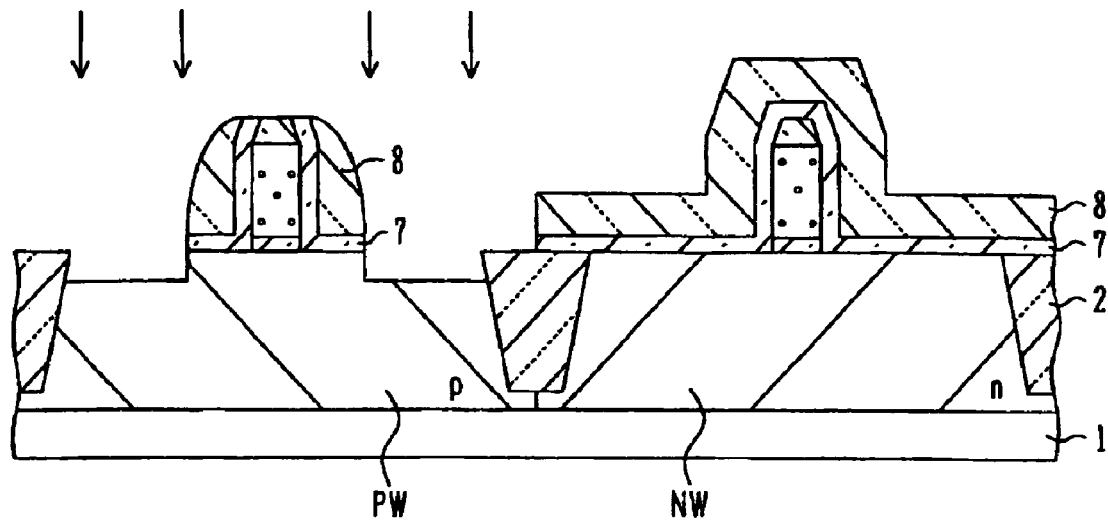
FIGS. 4A and 4B are cross sectional views illustrating processes of etching the source/drain regions of the NMOS transistor.

FIG. 4A illustrates a first etching process. The exposed silicon regions are anisotropically etched to a depth of 20 nm to 100 nm by reactive ion etching (RIE) using HBr as an etching gas.

Figure 4B:
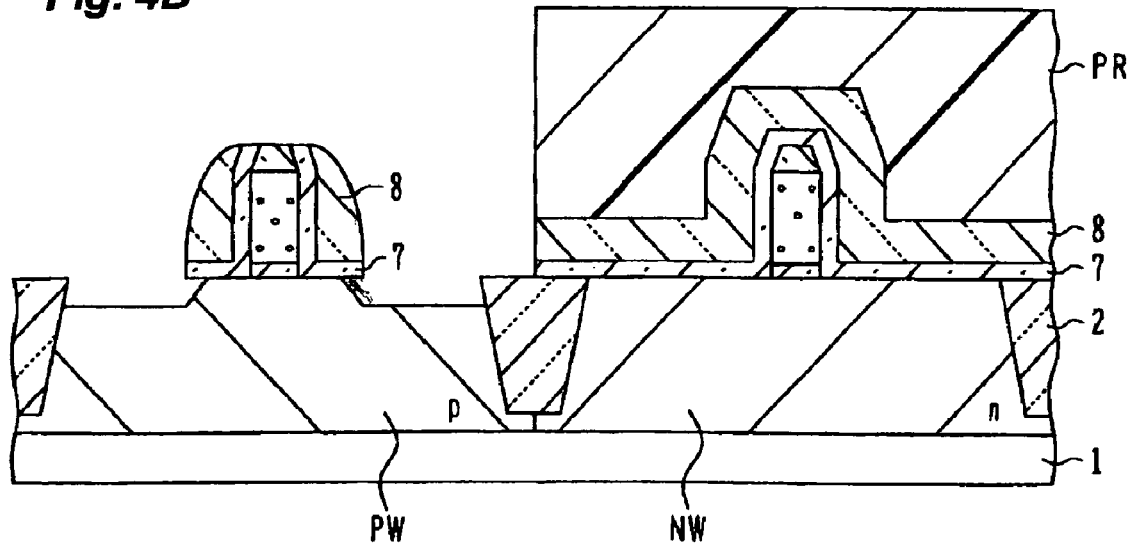

FIG. 4B illustrates a second etching process following the first etching process. First, a hydrofluoric acid pre-process is performed to remove a natural oxide film, then isotropical chemical etching is performed by using the silicon nitride film 8 and silicon oxide film 7 as an etching mask. For example, silicon is etched by 5 nm to 40 nm not only in a depth direction but also in a lateral direction, at 600° C. to 900° C. by using HCl as an etching gas. A length of extension regions to be later formed can be controlled by an isotropical etching depth. First recess are therefore formed on both side of the channel region, for forming source/drain regions of a different material.

$Cl_2$ may be used instead of HCl. Wet etching may be used instead of dry etching. However, it is necessary to take out the substrate in the atmospheric air for executing wet etching. If dry etching is used, it is advantageous in that it is easy to advance to the next epitaxial growth.

Next, Si—C mixed crystal of a second semiconductor having a smaller lattice constant than that of the first semiconductor is epitaxially grown selectively on the exposed surfaces of silicon of the first semiconductor.

Figure 5A:
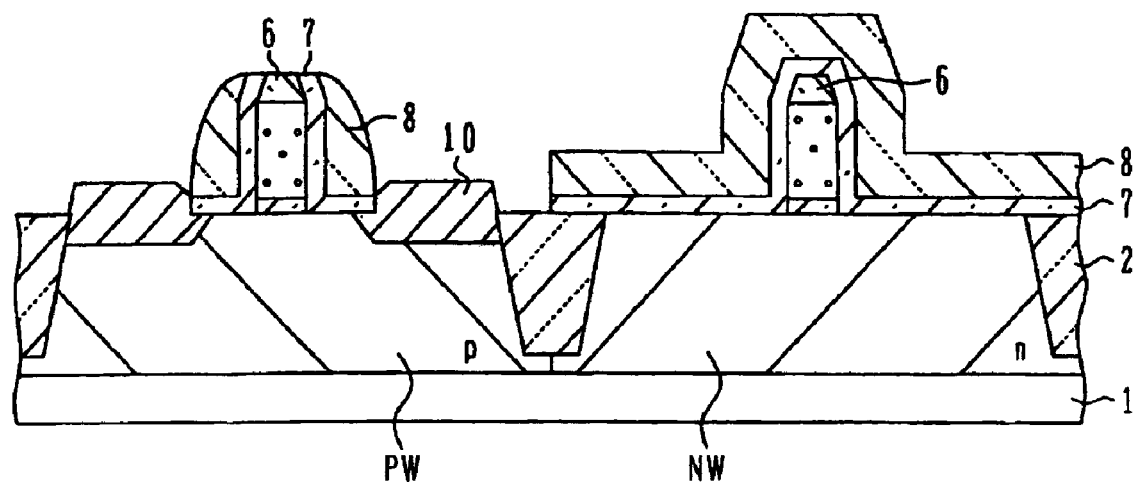
FIGS. 5A and 5B are cross sectional views illustrating processes of forming source/drain regions of the NMOS transistor by epitaxial growth.

As shown in FIG. 5A, Si—C mixed crystal is epitaxially grown by low pressure thermal CVD selectively on the silicon surfaces exposed outside the insulating films 7 and 8 in the NMOS transistor region. Growth temperature (substrate temperature) is set, for example, at 600° C. to 900° C. Gases, $SiH_2Cl_2$ (source gas for Si) at a flow rate of 50 sccm to 300 sccm, $SiH_3(CH_3)$ (source gas for C) at a flow rate of 2 sccm to 50 sccm, HCl at a flow rate of 30 sccm to 300 sccm, and $H_2$ are flowed. Pressure in a growth chamber is set, for example, at 100 Pa to 5000 Pa. With this selective epitaxial growth, Si—C crystal grows on the silicon surface and does not grow on the insulating films. The crystal grows first on the surface of the first recesses, filling the space under the overhanging insulating films 7 and 8, and continue to grow beside the insulating films 7 and 8 to form Si—C source/drain regions 10 having a protruded upper surface. The Si—C source/drain regions 10 bury the first recesses and have an uneven surface.

If the first semiconductor is Si, the C composition of Si—C of the second semiconductor having a lattice constant smaller than that of the first semiconductor is preferably set to 0.1 to 5.0 at %.

Instead of $SiH_2Cl_2$, other silane gasses such as $SiH_4$, $Si_2H_6$, $Si_3H_8$ and $Si_3Cl_6$ may be used as a source gas of Si. Instead of HCl, $Cl_2$ may be used. $SiH_3(CH_3)$ is used as a source gas of C.

Figure 5B:
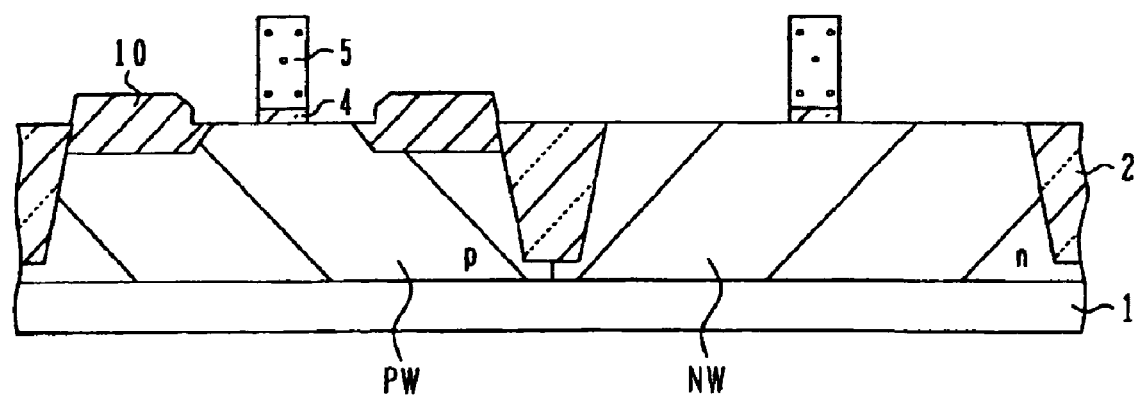

As shown in FIG. 5B, the insulating films 7 and 8 are removed. For example, the silicon nitride film 8 is removed by hot phosphoric acid, and the silicon oxide film 7 is removed by dilute hydrofluoric acid. The silicon nitride film 6 on the gate electrode is also removed at the same time.

In a state that sidewall spacers are not formed on the sidewalls of the gate electrodes, ion implantation is performed for forming extension regions of the source/drain regions and the pocket regions.

Figure 6A:
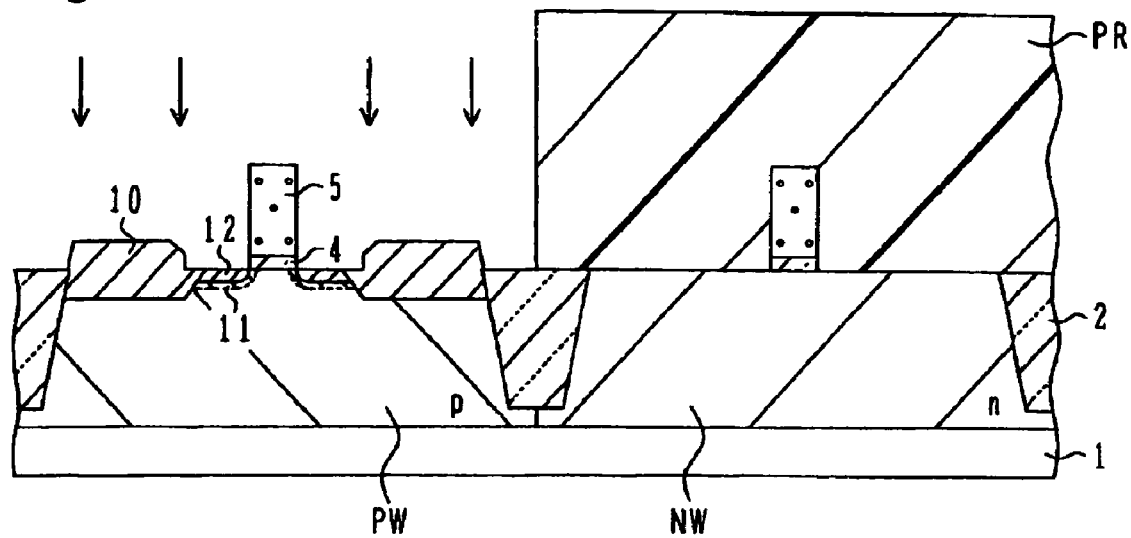
FIGS. 6A and 6B are cross sectional views illustrating ion implantation processes for forming pocket regions and extension regions.

As shown in FIG. 6A, a photoresist pattern PR covering the PMOS transistor region is formed, and p-type impurity ions are implanted into the NMOS transistor region. For example, In ions are implanted along four directions inclined from the plane normal under the conditions of an acceleration energy of 50 keV and a dose of $5 \times 10^{13}$ $cm^{-2}$ (hereinafter a notation such as 5E13 is used). With this p-type impurity ion implantation, pocket regions 11 having an increased p-type impurity concentration are formed in surface regions of the p-type well PW. Next, n-type impurity ions are implanted to form n-type extension regions 12. For example, As ions are implanted along a vertical direction under the conditions of an acceleration energy of 5 keV and a dose of 1E15. The peripheries of the extension regions 12 are covered with the pocket regions 11, so that a shallow junction can be formed. The photoresist pattern PR covering the PMOS transistor region is thereafter removed.

Figure 6B:
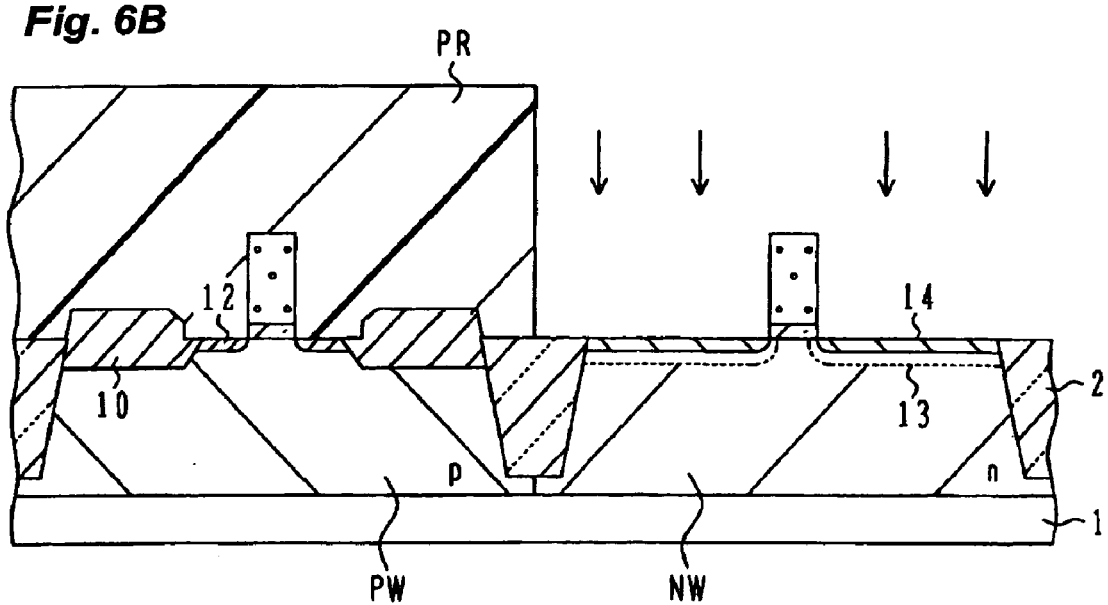

As shown in FIG. 6B, a photoresist pattern PR covering the NMOS transistor region is formed, n-type impurity ions are implanted into the PMOS transistor region to form n-type pocket regions 13, and p-type impurity ions are implanted to form p-type extension regions 14. For example, the n-type pocket regions 13 are formed by implanting n-type impurity ions, Sb ions, along four directions inclined from the plane normal under the conditions of an acceleration energy of 60 keV and a dose of 5E13, and the p-type extension regions 14 are formed by implanting p-type impurity ions, B ions, under the conditions of an acceleration energy of 5 keV and a dose of 1E15. The photoresist pattern PR covering the NMOS transistor region is thereafter removed.

Next, sidewall spacers for ion implantation for low resistance, high concentration source/drain regions are formed.

Figure 7A:
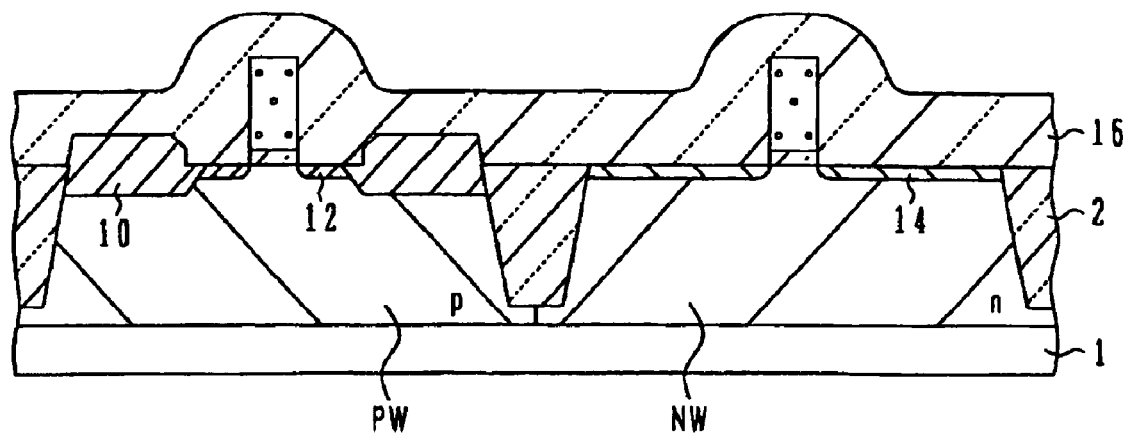
FIGS. 7A and 7B are cross sectional views illustrating processes of forming sidewall spacers on the side walls of gate electrodes.

As shown in FIG. 7A, a silicon oxide film 16 having a thickness of 30 nm to 100 nm is deposited on the substrate by thermal CVD, covering the gate electrode structures. For example, the thermal CVD is performed by using bistertialbuthylaminosilane (BTBAS) and $O_2$ used as source gases at a growth temperature of 500° C. to 580° C.

Figure 7B:
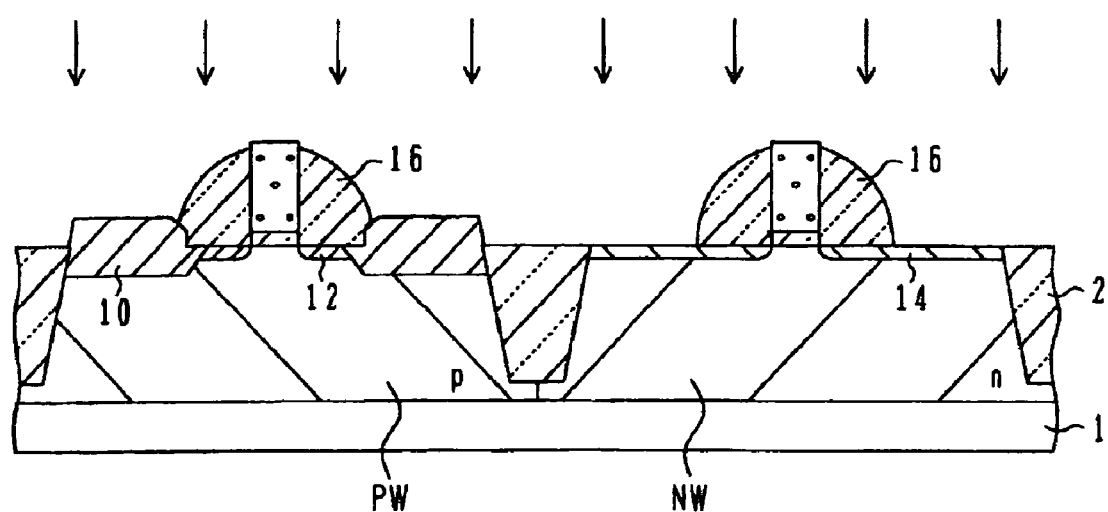

As shown in FIG. 7B, the silicon oxide film 16 is anisotropically etched by RIE to leave the silicon oxide film only on the sidewalls of the gate electrode structures, as sidewall spacers. Ion implantation for the source/drain regions are performed by using the sidewall spacers as an ion implantation mask.

Figure 8A:
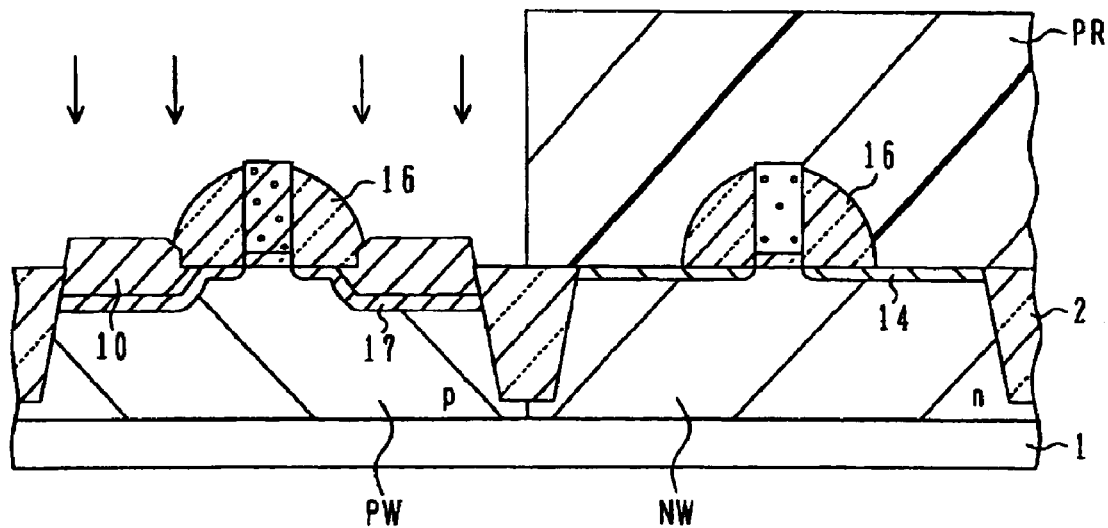
FIGS. 8A and 8B are cross sectional views illustrating processes of implanting ions to form the source/drain regions.

As shown in FIG. 8A, a photoresist pattern PR covering the PMOS transistor region is formed, and n-type impurity ions are implanted into the NMOS transistor region. For example, n-type impurity ions, P ions, are implanted at an acceleration energy of 6 keV and a dose of 1E16 to form low resistance n-type source/drain regions 17. As may be used in place of P, as n-type impurities. The photoresist pattern PR is thereafter removed.

Figure 8B:
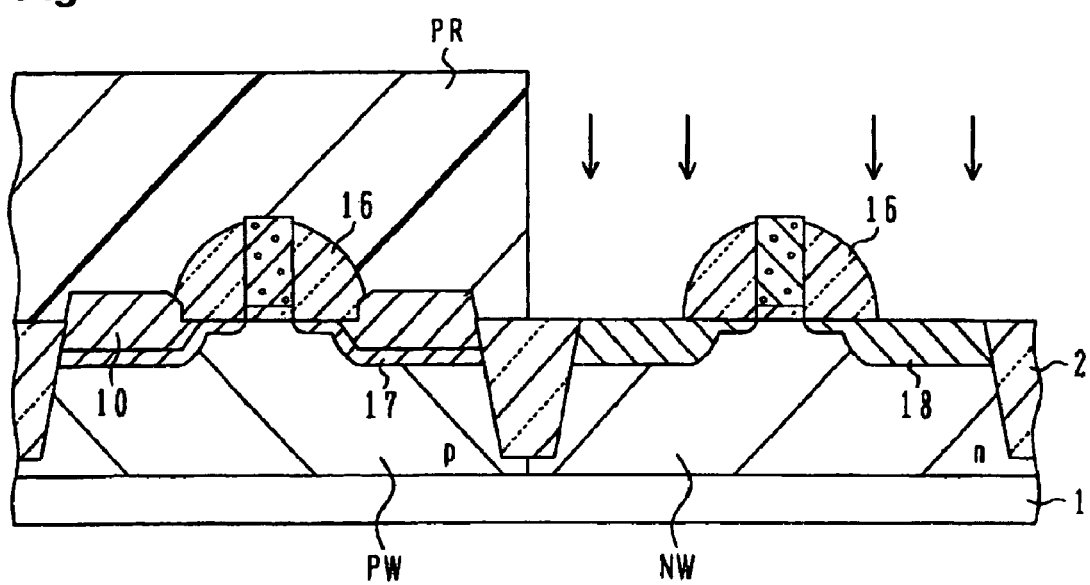

As shown in FIG. 8B, a photoresist pattern PR covering the NMOS transistor region is formed, and p-type impurity ions are implanted into the PMOS transistor region. For example, p-type impurity ions, B ions, are implanted at an acceleration energy of 8 keV and a dose of 5E15 to form p-type source/drain regions 18. The photoresist pattern PR is thereafter removed.

After the ion implantation for the source/drain regions, rapid thermal annealing (RTA) is performed, for example, at 1000° C. or higher to activate implanted impurity ions. Thereafter, an insulating mask is formed for forming the source/drain regions made of different material, in the PMOS transistor region.

Figure 9A:
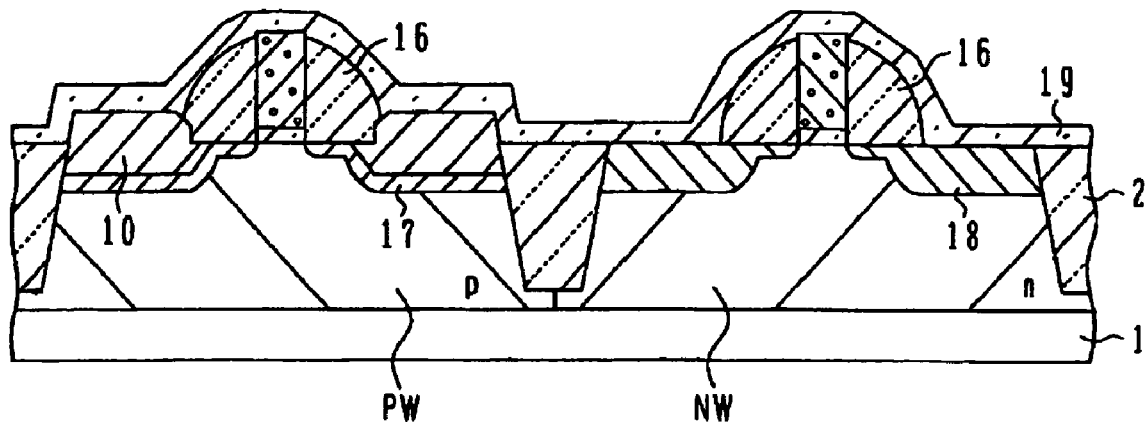
FIGS. 9A and 9B are cross sectional views illustrating processes of forming an insulating mask layer for forming source/drain regions of the PMOS transistor.

As shown in FIG. 9A, a silicon oxide film 19 is deposited on the substrate to a thickness of 20 nm to 100 nm by plasma enhanced (PE) CVD. For example, PE-CVD is performed by using TEOS as Si source gas at a growth temperature of 400° C. to 600° C.

Figure 9B:
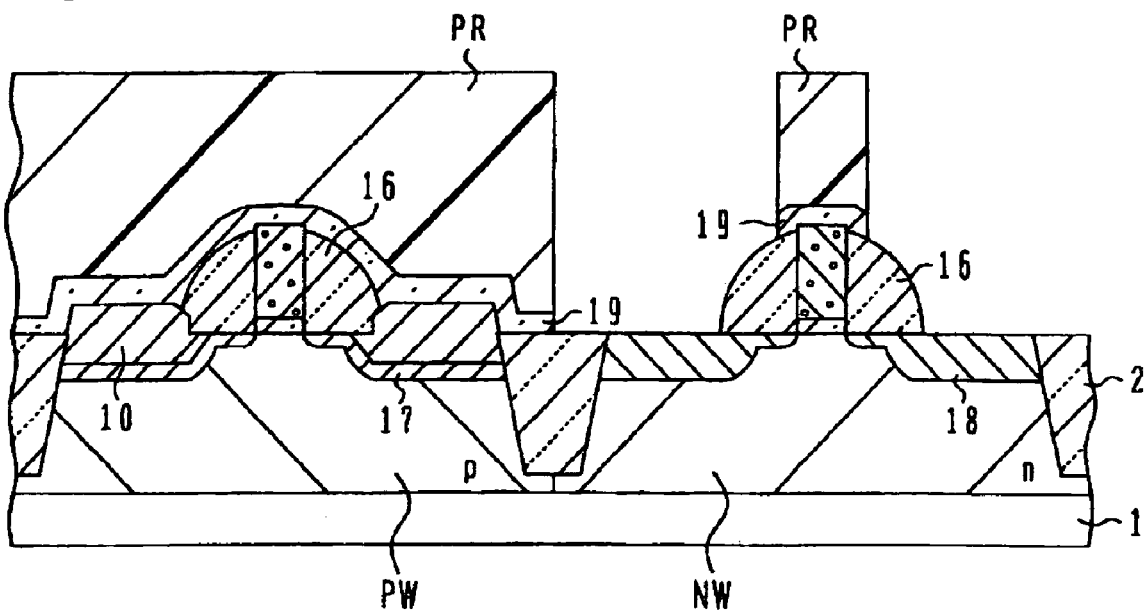

As shown in FIG. 9B, a photoresist pattern PR is formed covering the NMOS transistor region and the gate electrode of the PMOS transistor, and at least the silicon oxide film 19 on the source/drain regions of the PMOS transistor region is etched by using hydrofluorocarbon as etching gas. The silicon oxide film 16 formed by thermal CVD using BTBAS as Si source gas is hard to be etched more than the silicon oxide film 19 formed by PE-CVD using TEOS as Si source gas. It is therefore possible to etch the silicon oxide film 19 with priority over the silicon oxide film 16. The surfaces of the source/drain regions 18 of the PMOS transistor region are therefore exposed. The photoresist pattern PR is thereafter removed.

Figure 10A:
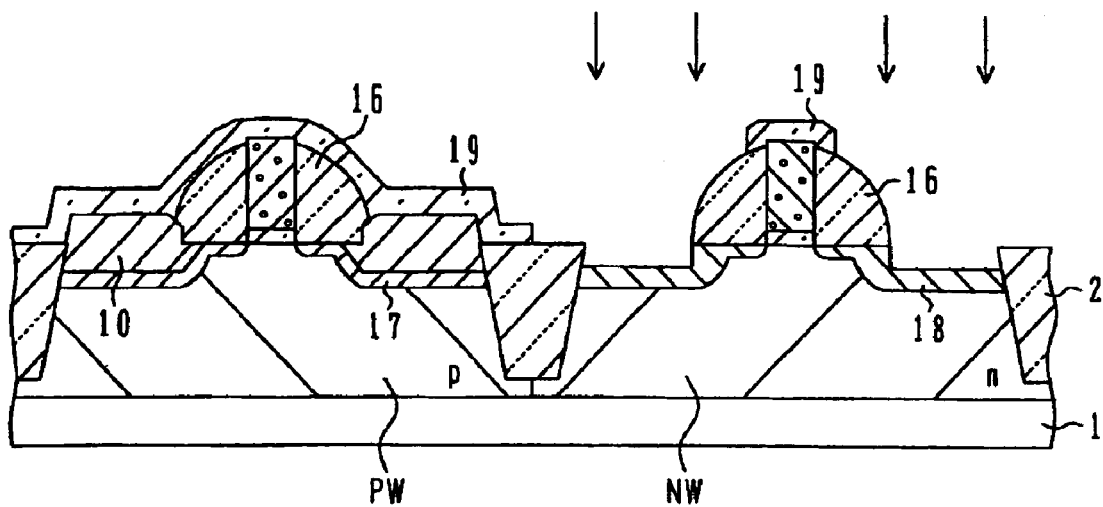
FIGS. 10A and 10B are cross sectional views illustrating processes of etching the source/drain regions of the PMOS transistor.

FIG. 10A shows a first etching process. By using the silicon oxide film 19 and sidewall spacers 16 as an etching mask, the silicon substrate exposed on both sides of the sidewall spacers of the PMOS transistor is anisotropically etched. For example, RIE using HBr as etching gas is performed to etch the silicon substrate by a depth of 20 to 100 nm.

Figure 10B:
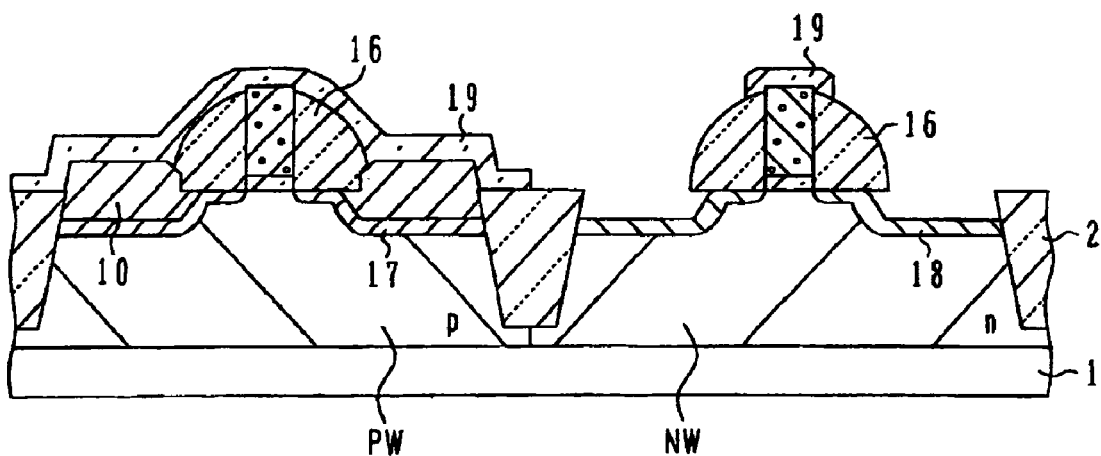

FIG. 10B shows a second etching process. After a natural oxide film formed on the silicon surface is etched by a hydrofluoric acid process, the silicon substrate is isotropically etched by chemical etching to a depth of 5 nm to 40 nm. For example, this etching is performed by using HCl as etching gas at 600° C. to 900° C. Etching progresses in the depth direction and also in the lateral direction. In this manner, a second recess is formed. $Cl_2$ may be used instead of HCl.

The first and second etching processes shown in FIGS. 10A and 10B are similar to the first and second etching processes shown in FIGS. 4A and 4B. Although wet etching may be performed instead of dry etching, the dry etching is advantageous in that the next epitaxial growth can be performed immediately thereafter.

Next, Si—Ge or Si—Ge—C mixed crystal of a third semiconductor having a lattice constant larger than that of the first semiconductor is epitaxially grown selectively on the exposed surface of silicon of the first semiconductor.

Figure 11A:
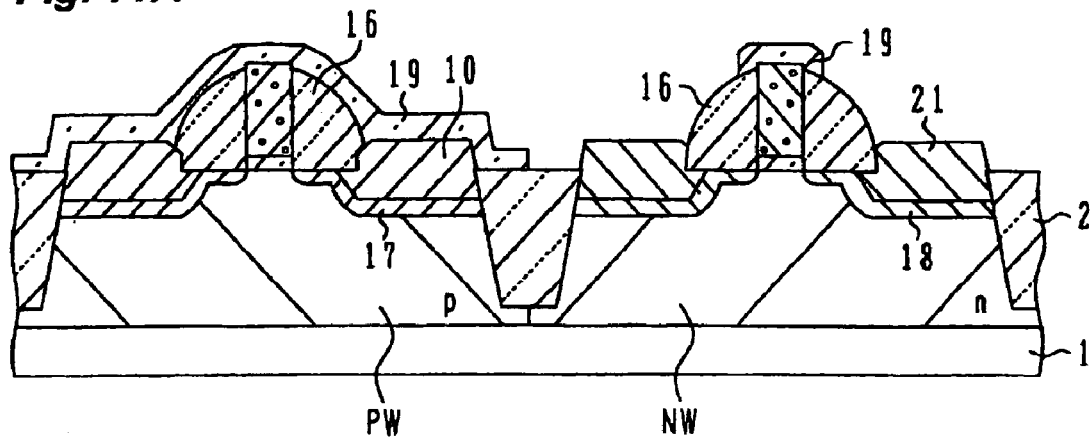
FIGS. 11A and 11B are cross sectional views illustrating processes of forming source/drain regions of the PMOS transistor by epitaxial growth.

As shown in FIG. 11A, Si—Ge or Si—Ge—C is epitaxially grown on the exposed silicon surface of the PMOS transistor by low pressure thermal CVD to form an epitaxial layer 21. For example, gases, $SiH_2Cl_2$ (source gas for Si) at a flow rate of 50 sccm to 300 sccm, $GeH_4$ (source gas for Ge) at a flow rate of 50 sccm to 300 sccm, $SiH_3(CH_3)$ (source gas for C) at a flow rate of 2 sccm to 50 sccm, HCl gas at a flow rate of 30 sccm to 300 sccm, and $H_2$ gas are flowed, at a growth temperature of 500° C. to 800° C. During the growth, p-type impurity ions B are doped. Pressure in a CVD chamber is set, for example, at 100 Pa to 5000 Pa.

If the third semiconductor having a lattice constant larger than that of Si of the first semiconductor layer is Si—Ge, a Ge composition is preferably set to 5 to 40 at %. When C is doped slightly, thermal stability can be improved although a strain amount reduces. It is effective to use Si—Ge—C having a good composition balance.

Epitaxial growth progresses only on a silicon surface and does not progress on an insulator surface. Growth progresses first on the surface of the second recess, and continues to progress beside the sidewall spacers to form epitaxial layers having a protruded upper surface.

In the above description, although the silicon oxide film 19 is left on the gate electrode of the PMOS transistor, the silicon oxide film 19 on the gate electrode may not be left. In this case, the polysilicon gate electrode is etched during the etching process for the source/drain regions. However, Si—Ge grows also on polysilicon during the Si—Ge growth process, so that a concavity once formed is filled with Si—Ge.

The sidewall spacers in the NMOS transistor region are formed after the Si—C source/drain regions 10 are formed. Therefore, the sidewall spacers have an uneven bottom surface in conformity with the uneven upper surfaces of the source/drain regions 10. The sidewall spacers 16 of the PMOS transistor region have a flat bottom surface because the sidewall spacers are formed before the Si—Ge source/drain regions 21 are grown.

It is preferable that the growth temperature of Si—C epitaxial growth shown in FIG. 5A is set higher than that of Si—Ge or Si—Ge—C epitaxial growth shown in FIG. 11A. Si—C has a higher growth temperature and higher thermal stability than those of Si—Ge or Si—Ge—C. It is possible to improve stability of the epitaxial growth films and provide thermally stable processes, by forming first the Si—C source/drain regions and thereafter forming the Si—Ge or Si—Ge—C source/drain regions.

Instead of $SiH_2Cl_2$, source gas for Si may be $SiH_4$, $Si_2H_6$, $Si_3H_8$, or $Si_3Cl_6$. $Cl_2$ may be used instead of HCl. These are similar to the epitaxial growth for Si—C. $GeH_2Cl_2$ may be used instead of $GeH_4$.

Figure 11B:
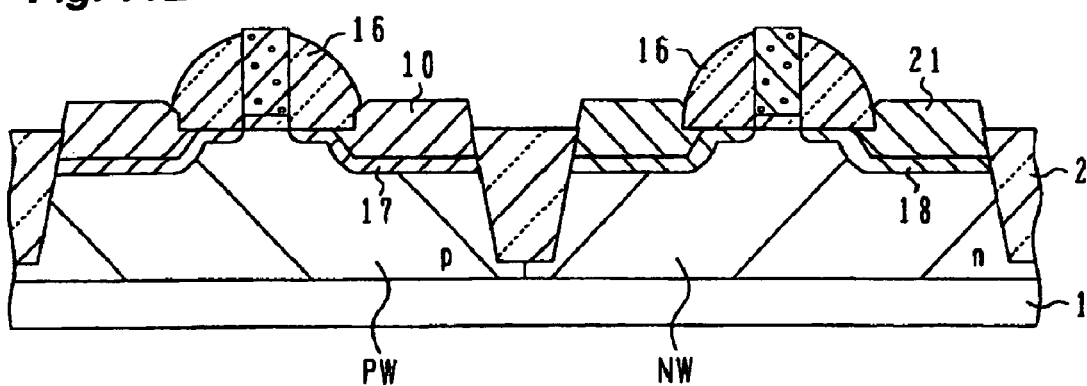

As shown in FIG. 11B, the insulating mask 19 of silicon oxide is removed by hydrofluoric acid or the like.

Figure 11C:
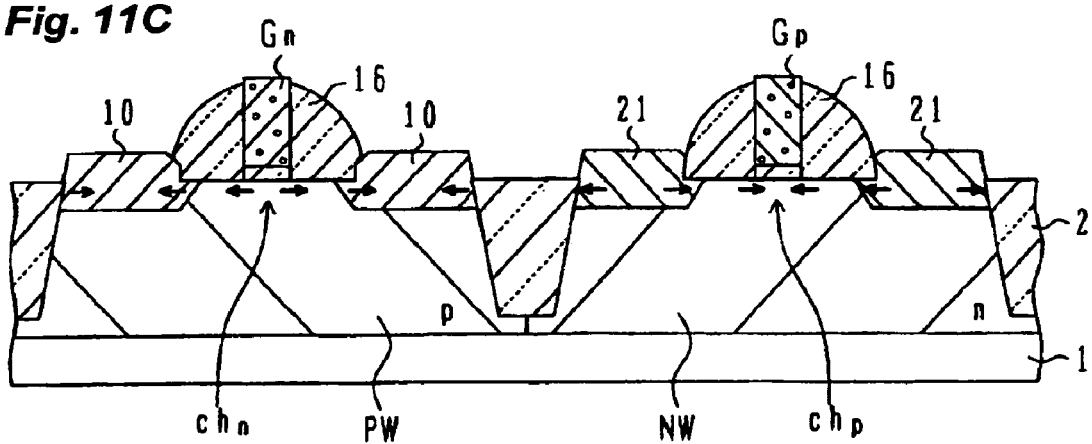
FIG. 11C is a schematic cross sectional view showing stresses in the NMOS and PMOS transistors.

FIG. 11C is a schematic cross sectional view showing stress in NMOS and PMOS transistors. The Si—C source/drain regions 10 of the NMOS transistor have a smaller lattice constant than that of Si of the semiconductor substrate, so that the source/drain regions tend to contract and apply a tensile stress to the channel Chn under the gate electrode Gn along a gate (or channel) length direction. The Si—Ge source/drain regions 21 of the PMOS transistor have a larger lattice constant than that of Si of the semiconductor substrate, so that the source/drain regions tend to expand and apply a compressive stress to the channel Chp under the gate electrode Gp along a gate (or channel) length direction. Therefore, mobilities of carriers in NMOS and PMOS transistors increase, allowing a high speed operation.

Figure 12:
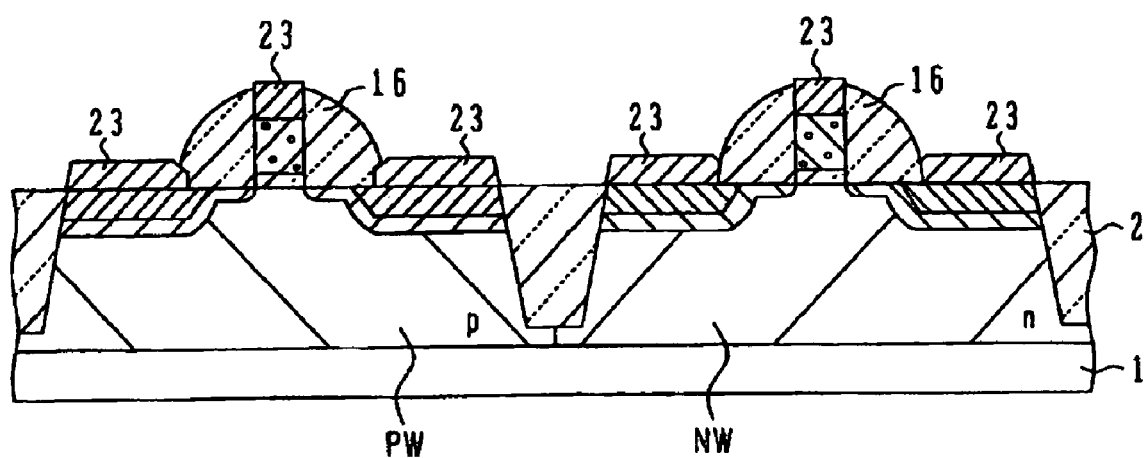
FIG. 12 is a cross sectional view illustrating a silicidation process.

As shown in FIG. 12, a silicide layer is formed. For example, a Ni film preferably having a thickness of 5 nm or thicker is deposited on the substrate by sputtering, and annealed to effect a silicidation reaction. After an unreacted Ni layer is removed, annealing may be performed again. In this manner, NiSi layers 23 are formed on the silicon surfaces. Instead of Ni silicide, other silicide may be formed such as Co silicide.

A semiconductor device having NMOS and PMOS transistors is manufactured in the manner described above. The source/drain regions of the NMOS transistor apply a tensile stress to the channel region made of the first semiconductors, because the source/drain regions are made of Si—C of the second semiconductor having a smaller lattice constant than that of Si of the first semiconductor. The source/drain regions of the PMOS transistor apply a compressive stress to the channel region made of the first semiconductor Si, because the source/drain regions are made of Si—Ge or Si—Ge—C of the third semiconductor having a larger lattice constant than that of Si of the first semiconductor. Accordingly, electron mobility in the NMOS transistor is improved and hole mobility in the PMOS transistor is improved. Drain current of the transistor increases and a high performance device can be manufactured.

Since the Si—C source/drain regions apply a tensile stress, a compressive stress of the HDP silicon oxide film buried in STI can be compensated for and the tensile stress can be applied effectively.

In the above description, Si is used as the first semiconductor constituting the channel region, Si—C mixed crystal is used as the second semiconductor constituting the source/drain regions of the NMOS transistor, and Si—Ge or Si—Ge—C mixed crystal is used as the third semiconductor constituting the source/drain regions of the PMOS transistor. The invention is not limited thereto.

For example, the first semiconductor may be made of Si—Ge (—C) mixed crystals, the second semiconductor may be made of Si or Si—Ge (—C) having a smaller Ge composition than that of the first semiconductor, and the third semiconductor may be made of Si—Ge (—C) having a larger Ge composition than that of the first semiconductor.

The present invention has been described in connection with the preferred embodiments. The invention is not limited only to the above embodiments. It will be apparent to those skilled in the art that various modifications, improvements, combinations, and the like can be made.

What we claim are:

1. A method of manufacturing a semiconductor device comprising:
    (1) forming a first gate electrode above an n-channel field effect transistor region of a semiconductor substrate made of a first semiconductor material, and forming a second gate electrode above a p-channel field effect transistor region of the semiconductor substrate made of the first semiconductor material;
    (2) forming a first insulating mask layer over the semiconductor substrate, covering the first gate electrode and the second gate electrode;
    (3) forming a resist mask covering the p-channel field effect transistor region and exposing the n-channel field effect transistor region, anisotropically etching the first insulating mask layer in the n-channel field effect transistor region to leave the first insulating mask layer as first sidewall spacers on sidewalls of the first gate electrode;
    (4) etching the semiconductor substrate in the n-channel field effect transistor region by using the first insulating mask layer, the first sidewall spacers and the first gate electrode as an etching mask, to form first recesses;
    (5) epitaxially growing a second semiconductor material different from the first semiconductor material, in the first recesses;
    (6) after epitaxially growing the second semiconductor material, removing the first insulating mask layer and the first sidewall spacers;
    (7) after removing the first insulating mask layer and the first sidewall spacers, forming second sidewall spacers of an insulating material on sidewalls of the first gate electrode and the second gate electrode;
    (8) after forming the second sidewall spacers, forming a second insulating mask layer covering the n-channel field effect transistor region;
    (9) etching the semiconductor substrate in the p-channel field effect transistor region by using the second insulating mask layer, the second sidewall spacers, and the second gate electrode, as an etching mask, to form second recesses; and
    (10) epitaxially growing a third semiconductor material different from the first semiconductor material, in the second recesses.

2. The method of manufacturing a semiconductor device according to claim 1, wherein at least one of said steps (4) and (9) includes an anisotropical etching process and an isotropical etching process following the anisotropical etching process.

3. The method of manufacturing a semiconductor device according to claim 1, further comprising between said steps (6) and (8) a step of implanting impurity ions into said one and other field effect transistor regions.

4. The method of manufacturing a semiconductor device according to claim 1, wherein said step (5) epitaxially grows the second semiconductor material containing Si and C at a first temperature, and said step (10) epitaxially grows the third semiconductor material containing Si and Ge at a second temperature lower than said first temperature.

5. The method of manufacturing a semiconductor device according to claim 1, wherein said first semiconductor is Si, said second semiconductor is Si—C mixed crystal, and said third semiconductor is Si—Ge or Si—Ge—C mixed crystal.

6. The method of manufacturing a semiconductor device according to claim 5, wherein each of said steps (4) and (9) includes (a) a reactive etching step for Si and (b) a chemical etching process for Si.

7. The method of manufacturing a semiconductor device according to claim 6, wherein said step (a) etches a depth of 20 to 100 nm and said step (b) etched a depth of 5 to 40 nm.

8. The method of manufacturing a semiconductor device according to claim 6, wherein said step (a) uses HBr as etchant.

9. The method of manufacturing a semiconductor device according to claim 6, wherein said step (b) etches at 600 to 900° C. using HCl or $Cl_2$ as etchant.

10. The method of manufacturing a semiconductor device according to claim 4, wherein said step (5) is performed by low pressure thermal CVD using silane gas as Si source gas and $SiH_3(CH_3)$ as C source gas.

11. The method of manufacturing a semiconductor device according to claim 4, wherein said step (10) is performed by low pressure thermal CVD using silane gas as Si source gas and $GeH_4$ as Ge source gas.

12. The method of manufacturing a semiconductor device according to claim 1, wherein said step (7) includes a step of depositing a silicon oxide film by thermal CVD using BTBAS and $O_2$ as source gasses.

* * * * *